(12) United States Patent
Firth et al.

(10) Patent No.: US 11,186,912 B2
(45) Date of Patent: Nov. 30, 2021

(54) SYSTEM AND METHODS FOR DEPOSITION SPRAY OF PARTICULATE COATINGS

(71) Applicant: ARIZONA BOARD OF REGENTS ON BEHALF OF ARIZONA STATE UNIVERSITY, Tempe, AZ (US)

(72) Inventors: Peter Alexander Firth, Peoria, AZ (US); Zachary Holman, Phoenix, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 16/206,866

(22) Filed: Nov. 30, 2018

(65) Prior Publication Data

US 2019/0100841 A1    Apr. 4, 2019

Related U.S. Application Data

(63) Continuation of application No. PCT/US2017/035532, filed on Jun. 1, 2017.
(Continued)

(51) Int. Cl.
  *C23C 24/04*    (2006.01)
  *B05B 7/00*    (2006.01)
  (Continued)

(52) U.S. Cl.
  CPC .......... *C23C 24/04* (2013.01); *B05B 7/0012* (2013.01); *B05B 12/02* (2013.01); *B05D 1/12* (2013.01); *C23C 4/134* (2016.01); *C23C 16/4486* (2013.01)

(58) Field of Classification Search
  CPC .................................................. C23C 16/4404
  See application file for complete search history.

(56) References Cited

U.S. PATENT DOCUMENTS 4,695,358 A * 9/1987 Mizuno ................. B03C 3/017
                                                     204/174
5,213,851 A * 5/1993 Snyder ................. C23C 16/408
                                                     427/126.3
(Continued)

FOREIGN PATENT DOCUMENTS

EP    1617449 A2    1/2006
EP    2428592 A1    3/2012
(Continued)

OTHER PUBLICATIONS

International Search Report and Written Opinion; PCT Application No. PCT/US2017/035532; dated Sep. 26, 2017.
(Continued)

*Primary Examiner* — Joseph A Miller, Jr.
(74) *Attorney, Agent, or Firm* — Fish & Richardson P.C.

(57) ABSTRACT

A particle deposition system can have a particle source providing a nanomaterial at a controlled rate and a gas distribution system coupled with the particle source and operable to receive the nanomaterial aerosol. A high pressure chamber can be coupled with the gas distribution system, and a nozzle can be disposed between the high pressure chamber and a low pressure chamber. The nozzle can have a nozzle opening allowing fluidic communication of a nanomaterial aerosol between the high pressure chamber and the low pressure chamber and the opening can have a length exceeding a width.

30 Claims, 10 Drawing Sheets

Related U.S. Application Data

(60) Provisional application No. 62/344,283, filed on Jun. 1, 2016.

(51) Int. Cl.
*B05B 12/02* (2006.01)
*B05D 1/12* (2006.01)
*C23C 16/448* (2006.01)
*C23C 4/134* (2016.01)

(56) References Cited

U.S. PATENT DOCUMENTS

| | | | |
|---|---|---|---|
| 5,874,134 | A | 2/1999 | Rao et al. |
| 6,277,448 | B2 | 8/2001 | Strutt et al. |
| 6,607,597 | B2 | 8/2003 | Sun et al. |
| 6,924,004 | B2 | 8/2005 | Rao et al. |
| 7,476,851 | B2 | 1/2009 | Wang et al. |
| 7,498,063 | B2 | 3/2009 | Pui et al. |
| 7,553,376 | B2 | 6/2009 | Akedo et al. |
| 8,865,271 | B2 | 10/2014 | Bi et al. |
| 8,888,920 | B2 | 11/2014 | Terada et al. |
| 2002/0106452 | A1* | 8/2002 | Choy .............. C23C 16/4486 427/314 |
| 2002/0134310 | A1 | 9/2002 | Condrashoff et al. |
| 2004/0046130 | A1* | 3/2004 | Rao .................. C23C 24/04 250/492.1 |
| 2004/0055534 | A1 | 3/2004 | Zeiffer et al. |
| 2005/0129843 | A1 | 6/2005 | Wu et al. |
| 2006/0051505 | A1* | 3/2006 | Kortshagen .......... B82Y 30/00 427/212 |
| 2007/0160872 | A1* | 7/2007 | Iwata ................ C30B 29/403 428/698 |
| 2007/0231480 | A1* | 10/2007 | Yasui ................ B05B 7/1404 427/212 |
| 2007/0243315 | A1 | 10/2007 | Buckley |
| 2008/0182114 | A1 | 7/2008 | Kim et al. |
| 2009/0017292 | A1 | 1/2009 | Hieslmair et al. |
| 2010/0119728 | A1* | 5/2010 | Johnson ............ C23C 28/3455 427/535 |
| 2011/0059246 | A1 | 5/2011 | Miyamoto et al. |
| 2011/0104369 | A1 | 5/2011 | Kim et al. |
| 2013/0189446 | A1* | 7/2013 | Casey .............. H01J 37/32082 427/569 |
| 2014/0004260 | A1 | 1/2014 | Fuchita et al. |
| 2014/0130740 | A1 | 5/2014 | Hsu et al. |
| 2014/0338586 | A1 | 11/2014 | Yoshikawa |
| 2014/0349073 | A1 | 11/2014 | Sun et al. |
| 2015/0128858 | A1 | 5/2015 | Mimura et al. |

FOREIGN PATENT DOCUMENTS

| | | | |
|---|---|---|---|
| EP | 2636771 | A1 | 9/2013 |
| JP | H06158306 | A | 6/1994 |
| JP | 2004-267964 | A | 9/2004 |
| JP | 2010-133019 | A | 6/2010 |
| WO | 2005116291 | A2 | 8/2005 |
| WO | 2005116291 | A2 | 12/2005 |
| WO | WO 2015/162035 | A1 | 10/2015 |

OTHER PUBLICATIONS

Office Action; U.S. Appl. No. 15/611,627; dated Aug. 10, 2017.
J.F. De La Mora et al., "Performance of a Hypersonic Impactor with Silver Particles in the 2 nm Range", J. Aerosol Sci., vol. 24, No. 3, pp. 409-415,1993.
R.C. Dykhuizen et al., "Gas Dynamic Principles of Cold Spray", Journal of Thermal Spray Technology, vol. 7, No. 2, pp. 205-212, 1998.
P. Firth, Substrate-Independent Nanomaterial Deposition Via Hypersonic Impaction, PhD thesis, Arizona State University, Tempe, AZ, Aug. 2015.
S.L. Girshick, "Aerosol Processing for Nanomanufacturing", J Nanopart Res 10, pp. 935-945, 2008.
J. Hafiz et al., "Hypersonic Plasma Particle Deposition—A Hybrid Between Plasma Spraying and Vapor Deposition", Journal of Thermal Spray Technolohu, vol. 15, N. 4, pp. 822-826, 2006.
B.L. Halpern et al., "Gas Jet Deposition of Thin Films", Applied Surface Science 48/49, pp. 10-26, 1991.
Z.C. Holman et al., "A Flexible Method for Depositing Dense Nanocrystal Thin Films: Impaction of Geranium Nanocrystals", Nanotechnology 21, 335302, 2010.
Z.C. Holman et al., Supplementary data for"A Flexible Method for Depositing Dense Nanocrystal Thin Films: Impaction of Geranium Nanocrystals", 2010.
C. Huang et al., "Supersonic Jet Deposition of Silver Nanoparticle aerosols: Correlations of Impact Conditions and Film Morphologies", J. Appl. Phys. 101, 064902, 2007.
S. Kashu et al., "Deposition of Ultra Fine Particles Using a Gas Jet", Jpn. H. Appl. Phys., vol. 23, No. 12, pp. L910-L912, 1984.
P. Milani, "Cluster Beam Synthesis of Nanostructured Thin Films", J. Vac. Sci. Technol. A 19(4), pp. 2025-2033, 2001.
C.R. Perrey et al., "Characterization of Nanoparticle Films and Structures Produced by Hypersonic Plasma Particle Deposition", Mat. Re. Soc. Symp. Proc. vol. 740, 2003.
N.P. Rao et al., "Hypersonic Plasma Particle Deposition of Nanostructured Silicon and Silicon Carbide", J. Aerosol Sci. Mol. vol. 29, No. 5/6, pp. 707-720, 1998.
K. Recknagle et al., "Design and Operation of a Nanocluster Generation and Collection System", Aerosol Science and Technology, 22:1, pp. 3-10, 1995.
Rushford Hypersonic, NDIA Joint Armaments Conference Presentation, May 19, 2010.
K. Wegner et al., "Cluster Beam Deposition: A Tool for Nanoscale Science and Technology", J. Phys. D: Appl. Phys. 29, R439-459, 2006.
P.A. Firth et al., "Formation of Nanoparticle Films via Hypersonic Particle Deposition", 2016 MRS Spring Meeting & Exhibit, Phoenix, Arizona, Poster NT6.10.21, Mar. 31, 2016.
P. Firth et al., "Large-Area Nanoparticle Film Deposition via Hypersonic Particle Deposition", 2016 MRS Fall Meeting & Exhibit, Boston, Massachusetts, presentation PM5.7.06, Nov. 30, 2016.
J. Akedo, "Aerosol Deposition Method for Fabrication of Nano Crystal Ceramic Layer", Materials Science Forum, vols. 449-452, pp. 43-48, Switzerland, Mar. 15, 2004.
EP Extended European Search Report in European Appln. No. 17807512.3, dated Sep. 1, 2020, 9 pages.
PCT International Preliminary Report on Patenability in International Appln. No. PCT/US2017/035532, dated Dec. 13, 2018, 8 pages.
JP Office Action in Japanese Appln. No. JP 2018-563617, dated Mar. 18, 2021, 8 pages (with English translation).

* cited by examiner

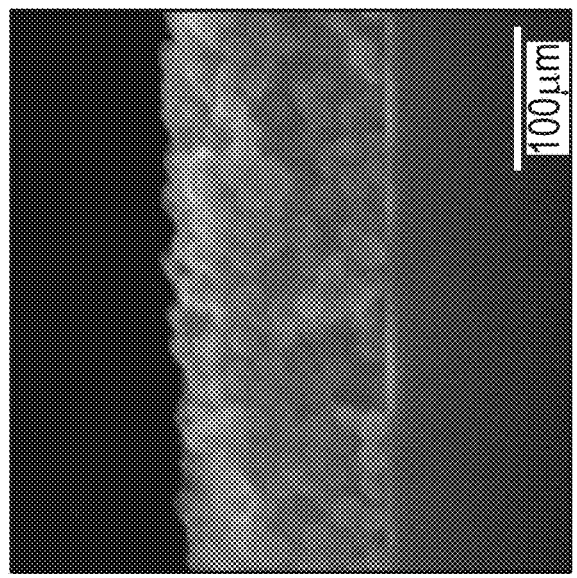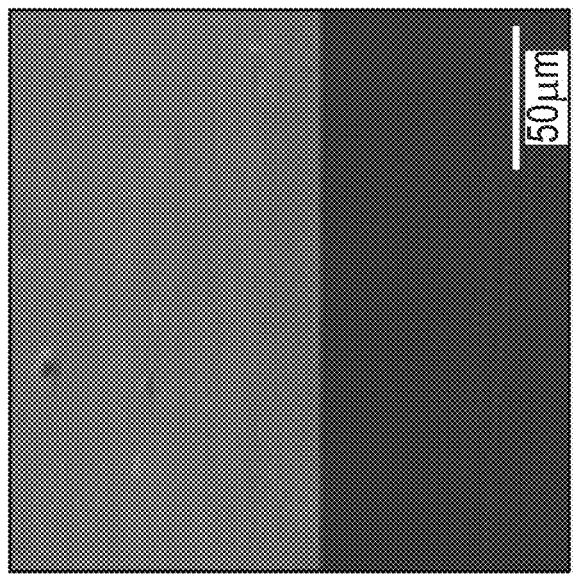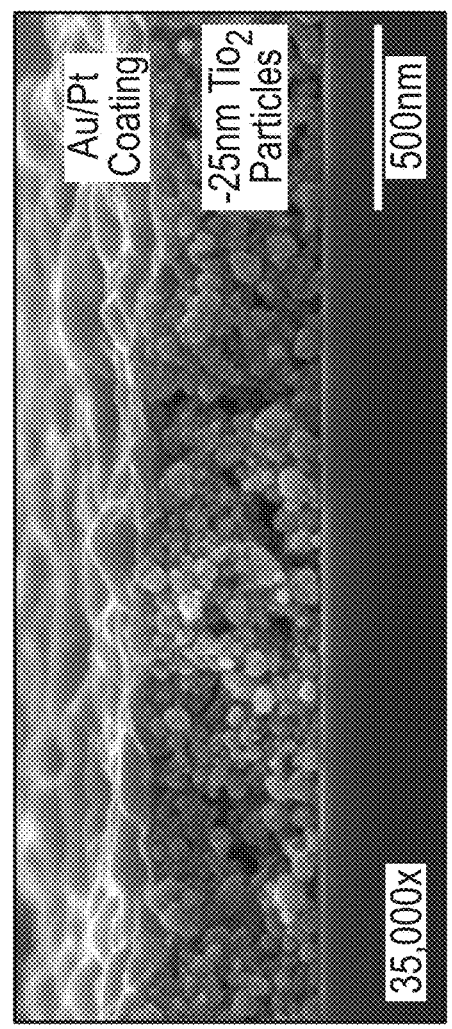
FIG. 8A
FIG. 8B

SYSTEM AND METHODS FOR DEPOSITION SPRAY OF PARTICULATE COATINGS

CROSS REFERENCE TO RELATED APPLICATIONS

This application is a continuation of Patent Cooperation Treaty Application No. PCT/US2017/035532, filed Jun. 1, 2017, which claims priority to U.S. Provisional Application No. 62/344,283 filed Jun. 1, 2016, the contents each of which are entirely incorporated herein.

FIELD

The present disclosure relates to spray coatings. More specifically, the present disclosure relates to deposition spray of particulate coatings.

BACKGROUND

Functional coatings play a role in the development of next generation products in the textile, display, automotive, energy and health care industries. These functional coatings can be formed from a nanomaterial disposed on a substrate, for example through deposition. Nanomaterial based coatings can be widely formed in a laboratory setting; however, development of scalable, precise coatings have proven unsuccessful.

BRIEF DESCRIPTION OF THE DRAWINGS

Implementation of the present technology will now be described, by way of example only, with reference to attached figures, wherein:

FIG. 8A is scanning electron microscope (SEM) micrograph of a nanomaterial coating of silica ($SiO_2$) applied using a particle deposition system according to the present disclosure;

FIG. 8B is an SEM micrograph of a nanomaterial coating of $TiO_2$ applied using a particle deposition system according to the present disclosure;

Figure 1:
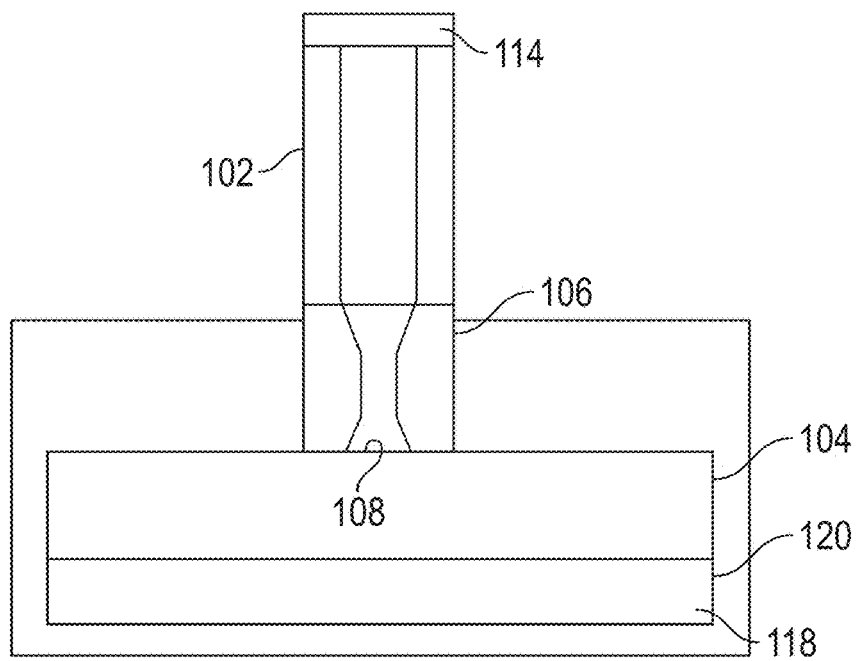
FIG. 1 is a diagrammatic view of an example of a particle deposition apparatus in accordance with the present disclosure.

The various embodiments described above are provided by way of illustration only, may not be shown to scale, and should not be construed to limit the scope of the disclosure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, especially in matters of shape, size and arrangement of the parts within the principles of the present disclosure to the full extent indicated by the broad general meaning of the terms used in the attached claims. It will therefore be appreciated that the embodiments described above can be modified within the scope of the appended claims. Claim language reciting "at least one of" a set indicates that one member of the set or multiple members of the set satisfy the claim.

DETAILED DESCRIPTION

For simplicity and clarity of illustration, where appropriate, reference numerals have been repeated among the different figures to indicate corresponding or analogous elements. In addition, numerous specific details are set forth in order to provide a thorough understanding of the implementations described herein. However, those of ordinary skill in the art will understand that the implementations described herein can be practiced without these specific details. In other instances, methods, procedures and components have not been described in detail so as not to obscure the related relevant feature being described. Also, the description is not to be considered as limiting the scope of the implementations described herein.

Several definitions that apply throughout this disclosure will now be presented. "Coupled" refers to the linking or connection of two objects. The coupling can be direct or indirect. An indirect coupling includes connecting two objects through one or more intermediary objects. Coupling can also refer to electrical or mechanical connections. Coupling can also include magnetic linking without physical contact. "Substantially" refers to an element essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

A "nanomaterial" is any material of which a single unit is sized between 1 and 1,000 nanometers. "Deposition" is any process by which particles collect or deposit themselves on solid or semi-solid surfaces. "High pressure" can be any pressure above zero and "low pressure" can be any pressure below "high pressure."

"Hypersonic" is any speed exceeding five (5) times the speed of sound. "Supersonic" is any speed exceeding the speed of sound. "Subsonic" is any speed less than the speed of sound.

The various embodiments described above are provided by way of illustration only and should not be construed to limit the scope of the disclosure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, especially in matters of shape, size and arrangement of the parts within the principles of the present disclosure to the full extent indicated by the broad general meaning of the terms used in the attached claims. It will therefore be appreciated that the embodiments described above can be modified within the scope of the appended claims. Claim language reciting "at least one of" a set indicates that one member of the set or multiple members of the set satisfy the claim. For example, at least one of A, B, and C, indicates the members can be just A, just B, just C, A and B, A and C, B and C, or A, B, and C.

The present disclosure is drawn to a particle deposition system, apparatus, and related method. A particle deposition system in accordance with the present disclosure can include a particle source providing a nanomaterial at a controlled rate and a gas distribution system coupled with the particle source and operable to receive the nanomaterial. In at least one example, the gas distribution system can be a gas showerhead. A high pressure chamber can be coupled with the gas distribution system. A nozzle can be disposed between the high pressure chamber and a low pressure chamber. The nozzle can have a nozzle opening allowing fluidic communication between the high pressure chamber and the low pressure chamber. The nozzle opening can have a length exceeding a width, thus forming a substantially slit shaped nozzle.

The low pressure chamber can be operable to receive a substrate and the nozzle can be operable to accelerate a nanomaterial aerosol onto the substrate. In at least one example, the nanomaterial aerosol can be accelerated onto the substrate at hypersonic speeds. In other examples, the nanomaterial aerosol can be accelerated onto the substrate at supersonic or subsonic speeds.

The nozzle opening can have an adjustable cross-sectional area. The width of the nozzle opening can be formed from two opposing edges, at least one of the opposing edges movable relative to the other of the opposing edges. Movement of the at least one opposing edge relative to the other of the opposing edges can thus increase or decrease the width of the nozzle opening, thereby adjusting the cross-sectional area. In at least one example, the moveable at least one opposing edge can be coupled with an electric servo motor configured to move the at least one opposing edge relative to the other of the two opposing edges. In another example, each of the two opposing edges can be independently movable relative to each other.

The nozzle geometry (specifically the cross-sectional shape), the separation of the nozzle and the substrate, the pressure drop across the nozzle, and the absolute pressure in the high and low pressure chambers can individually affect the nanomaterial when it impacts the substrate. Thus, by manipulating these properties individually or in combination, the impact velocity can be controlled. A high impact velocity results in films where particles are packed closely together. A low impact velocity results in films where particles are packed less closely together. Packing density of particles can be referred to in terms of the porosity, with densely packed films having a low porosity and less densely packed films having a higher porosity.

Adjustment of the nozzle/substrate separation, the impact velocity can be changed and thus the measured porosity changes. Adjustment of the nozzle geometry, the pressure drop across the nozzle, and the absolute pressure in the chamber can similarly adjust the porosity of the film coating. Individual or collective adjustment of these properties can allow for very fine control of the porosity. Highly porous films (low impact velocity) can appear "fluffy" when viewed with a scanning electron micrograph (SEM) while less porous films (higher impact velocity) can look more like a single solid film. The thickness and porosity of film coatings can by varied independently of each other. The porosity can be varied between 27% and 95% and the thickness between 5 nm and 1 mm.

The low pressure chamber can include a substrate receiving element. The substrate receiving element can have an adjustable height relative to the nozzle. The nozzle can be moveable relative to the substrate receiving element. The substrate receiving element can include two rollers at opposing ends of the low pressure chamber. One roller can be coupled with a first end of the substrate and the other roller can be coupled with a second end of the substrate with the substrate transitionable from one roller to the other. In other examples, the substrate receiving element can be translated using a screw drive powered by one or more servo motors.

The particle source can be an atomizer, a plasma reactor, a thermal reactor, and/or a flame reactor. The particle source can produce an aerosol from colloidal particles, solvent evaporation, polymer/monomer formation, powder sources, or precursor gases. In at least one embodiment, the high pressure chamber can be a plasma reactor and precursor gasses can be fed into the reactor where the plasma catalyzes particle nucleation and growth of nanoparticles.

In other examples, the high pressure chamber can also be a thermal reactor, where precursor gasses or liquids are fed into the reactor and the nucleation and growth of particles is induced. In yet other examples, the high pressure chamber can also be a plasma reactor designed not to synthesize particles, but rather to modify them. The high pressure chamber can sustain a plasma designed to etch the nanomaterial fed into it.

The low pressure chamber can be maintained at a pressure of approximately 0.001 to 100 Torr and the high pressure chamber can be maintained at a pressure between 2 and 100 times higher than the low pressure chamber. Typical operation of the high pressure chamber can be between 0.5 Torr and 200 Torr.

The particle deposition apparatus and related system can provide multiple high pressure chambers attached to a single low pressure chamber, thus allowing multiple film coatings with either identical or varying properties to be deposited on a substrate either sequentially or simultaneously. The particle deposition system and apparatus further allows multiple settings to control film coating porosity and thickness accurately across the substrate. Adjustment of the pressure within one of the high pressure chamber, the low pressure chamber, and/or the flow rate or pressure of the particle source along with adjusting the cross-sectional area of the nozzle opening and the distance between the nozzle and the substrate to be coating can provide a multi-variable adjustment to provide a film coating with particular properties.

FIG. 1 illustrates a diagrammatic view of an example particle deposition apparatus according to the present disclosure. The particle deposition apparatus 100 can have a high pressure chamber 102 and a low pressure chamber 104. A nozzle 106 can be disposed between the high pressure chamber 102 and the low pressure chamber 104. A nozzle opening 108 can provide fluidic communication between the high pressure chamber 102 and the low pressure chamber 104. The nozzle opening 108 can have a length 110 exceeding a width 112 (shown more clearly in FIG. 2.)

The high pressure chamber 102 can be coupled with a gas distribution system 114 receiving a nanomaterial 116 from a particle source. The nanomaterial can pass through the nozzle opening 108 and accelerate before entering the low pressure chamber 104. The gas distribution system 114, the high pressure chamber 102, and the slit-shaped nozzle 106 can be used together to uniformly distribute nanomaterial 116 from a point source over the width of the substrate 120. In at least one example, the particle deposition system can create non-uniformities of less than 10%.

The low pressure chamber 104 receives the accelerated nanomaterial 116. The low pressure chamber 104 can have a substrate receiving element 118 and a substrate 120. The substrate receiving element 118 can couple with and/or secure the substrate 120 within the low pressure chamber 104. At least a portion of the substrate 120 can be disposed beneath the nozzle opening 108 and the nanomaterial 116 can accelerate through the nozzle opening 108 onto the substrate 120. The nanomaterial 116 can accelerate onto the substrate 120 forming a substantially uniform surface coating on the substrate 120 (shown more clearly in FIGS. 3A-3C).

The substrate receiving element 118 can allow the translation of the substrate 120 within the low pressure chamber 104. The substrate 120 can be translatable in a direction at least perpendicular to the length 110 of the nozzle opening 108. The substrate receiving element 118 can provide translation of the substrate 120 in one direction, two directions, or any number of directions. In at least one example, the substrate receiving element 118 can provide translation of the substrate in a direction perpendicular to the length 110 of the nozzle opening, parallel to the length 110 of the nozzle opening, and adjust the height of the substrate 120 relative to the nozzle opening 108. Translation of the substrate 120 within the low pressure chamber 104 can allow the nanomaterial 116 exiting the nozzle opening 108 to impact different portions of the substrate allowing edge-to-edge coverage. Adjustment of the height of the substrate 120 relative to the nozzle 106 can alter the porosity of the film coating 122 formed on the substrate.

The low pressure chamber 104 can have a vacuum pump configured to maintain the low pressure chamber 104 below atmospheric pressure during operation. The high pressure chamber 102 can be maintained at a pressure above that of the low pressure chamber 104. In at least one example, the high pressure chamber 102 can be above atmospheric pressure.

Figure 2:
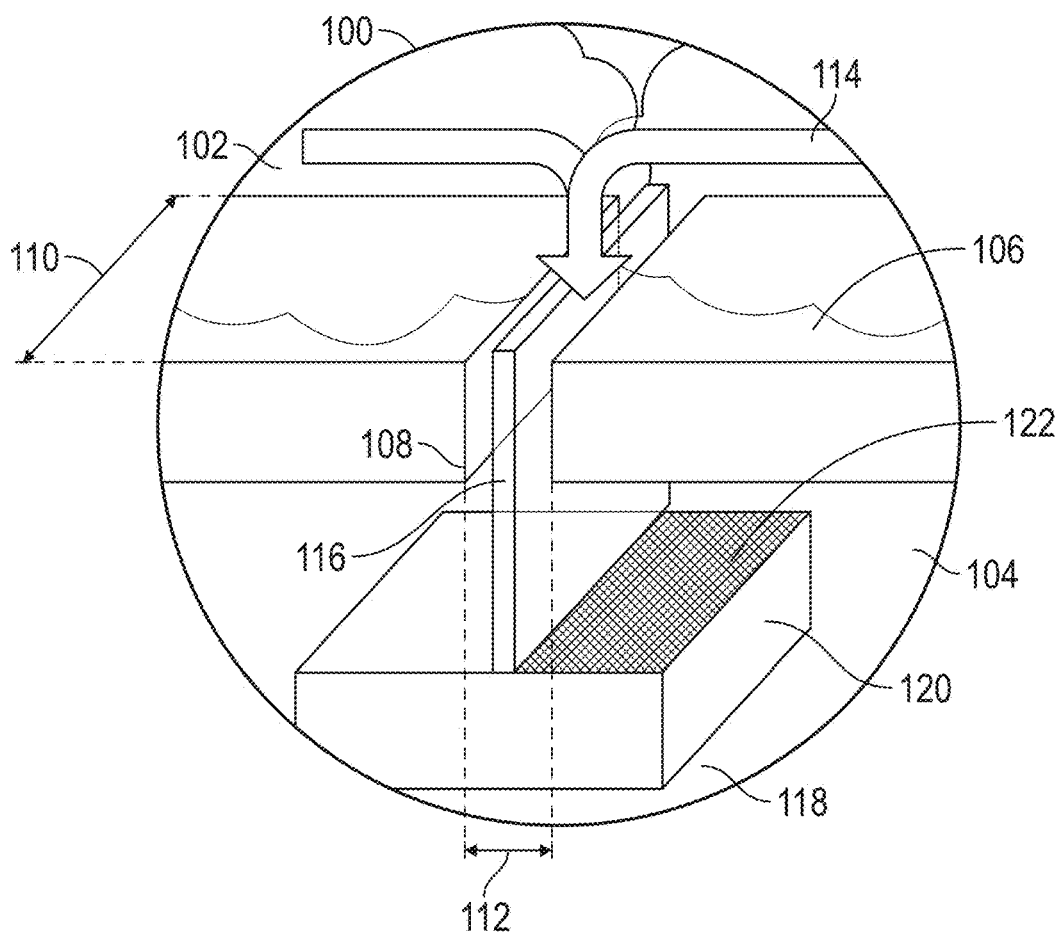
FIG. 2 is a detailed diagrammatic view of an example of a particle deposition apparatus in accordance with the present disclosure.

FIG. 2 illustrates a detailed view of an example particle deposition apparatus. The nozzle 106 of the particle deposition apparatus 100 can provide fluidic communication between the high pressure chamber 102 and the low pressure chamber 104. The nozzle opening 108 can be a substantially slit-shaped, having the length 110 exceeding the width 112. While the nozzle opening 108 is illustrated having a substantially slit-shape, other nozzle opening 108 can be implemented and are within the scope of this disclosure. In at least one example, the nozzle 106 can be ring shaped to allow coating of cylindrical objects.

The nanomaterial 116 can form a synthesized solution in the high pressure chamber 102 before entering the low pressure chamber 104 via the nozzle 106. The high pressure chamber 102 can introduce gases or vapors to the nanomaterial 116 to modify and/or synthesize the nanomaterial 116.

The nozzle opening 108 can be a minimal cross-sectional area causing the nanomaterial 116 to accelerate to a high velocity. In at least one example, the nanomaterial 116 can accelerate through the nozzle 106 to a hypersonic speed. In other examples, the nanomaterial 116 can accelerate through the nozzle 106 to a supersonic or subsonic speed. The acceleration of the nanomaterial 116 through the nozzle 106 can depend on the geometry of the nozzle 106 and/or the nozzle opening 108, the pressure ratio between the high pressure chamber 102 and the low pressure chamber 104, the flow rate of the nanomaterial 116, the height of the nozzle 106, and/or the absolute upstream and/or downstream pressure. The acceleration of the nanomaterial 116 through the nozzle opening can also be limited by the terminal velocity of the nanomaterial 116 particle being implemented.

The substantially slit-shaped nozzle opening 108 accelerates the nanomaterial 116 onto the substrate 120 forming a film coating 122 on the surface of the substrate 120. In at least one example, the nozzle opening 108 can have a length 110 equal to or greater than a width 124 of the substrate 120 allowing complete edge-to-edge coverage of the film coating 122 on the substrate 120. In other examples, the length 110 of the nozzle opening 108 can be less than the width 124 of the substrate 120.

Figure 3B:
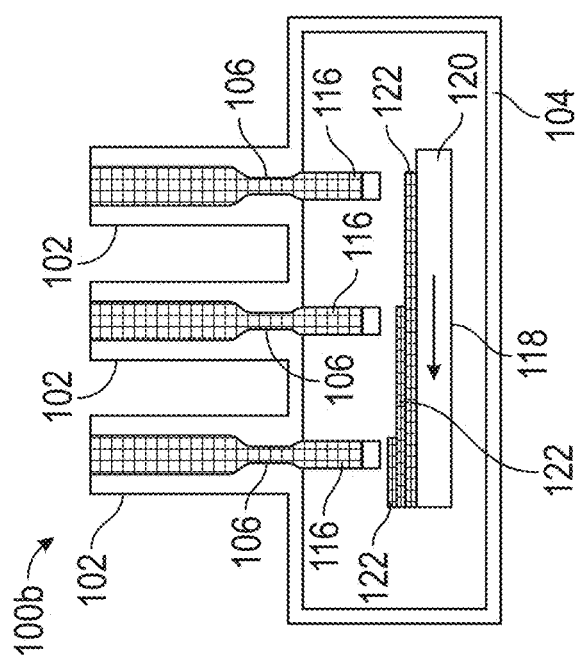
FIG. 3B is a diagrammatic view of an example particle deposition apparatus having a plurality of nozzles forming three different material coatings in accordance with the present disclosure.
Figure 3C:
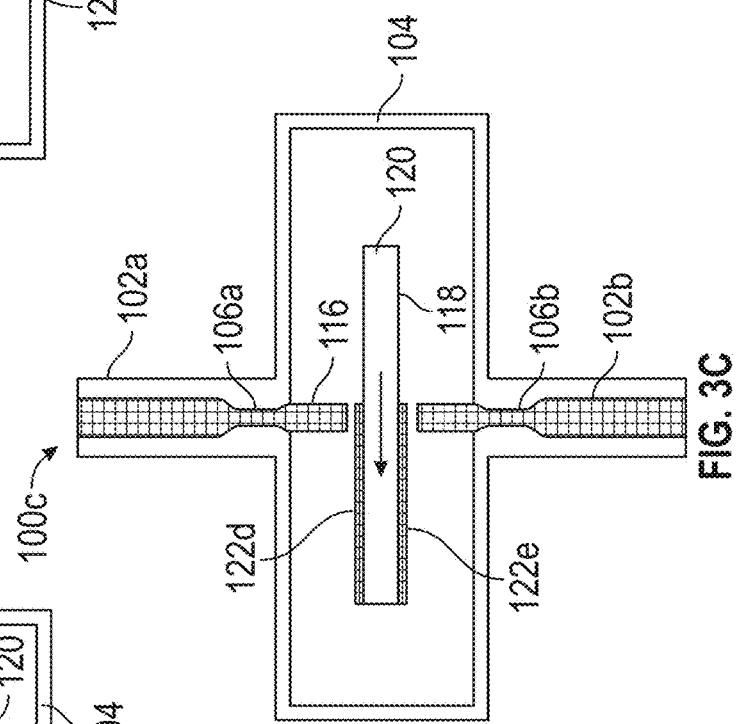
FIG. 3C is a diagrammatic view of an example particle deposition apparatus having an upper nozzle and a lower nozzle in accordance with the present disclosure.
Figure 3A:
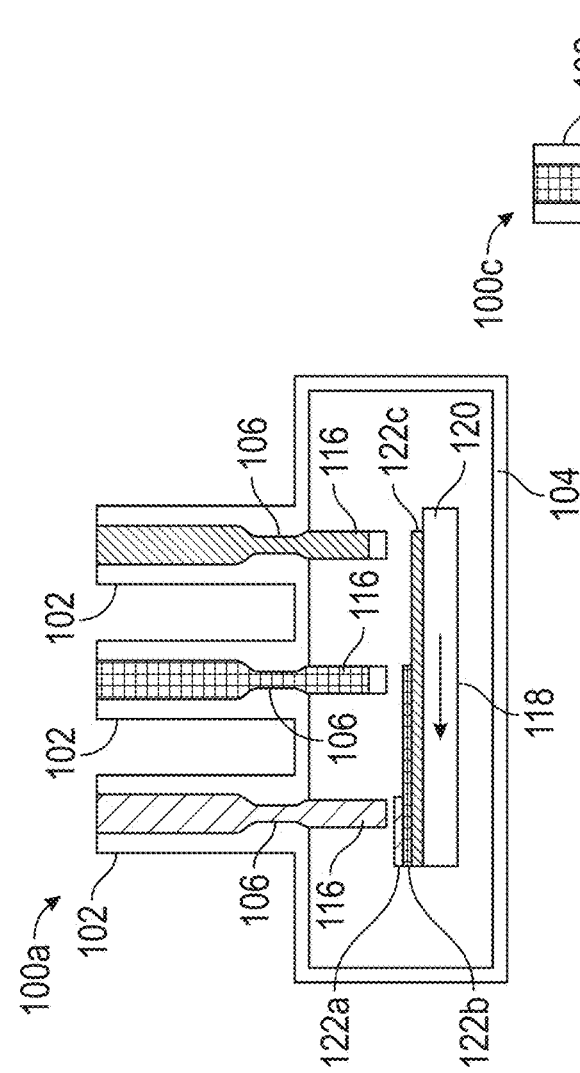
FIG. 3A is a diagrammatic view of an example particle deposition apparatus having a plurality of nozzles forming a single material coating in accordance with the present disclosure.

FIGS. 3A, 3B, and 3C illustrate example embodiments of particle deposition apparatus. FIG. 3A illustrates a particle deposition apparatus 100a having a plurality of high pressure chambers 102 and a plurality of nozzles 106. Each of the plurality of high pressure chambers 102 can be coupled with an individual nozzle 106 of the plurality of nozzles 106. Each of the plurality of high pressure chambers 102 can receive a different nanomaterial 116 to form individual film coatings 122a, 122b, 122c. The plurality of high pressure chambers 102 can be held at identical pressures or varying pressures depending on the various nanomaterials 116 implemented within each high pressure chamber 102. The plurality of nozzles 106 can vary in geometric design, cross-sectional area, and/or nozzle depth. The substrate 120 can be held within a low pressure chamber 104, thus allowing varying pressure drops for the plurality of nozzles 106 depending on the pressure maintained within the individual high pressure chambers 102.

FIG. 3B illustrates a particle deposition apparatus 100b having a plurality of high pressure chambers 102 and a plurality of nozzles 106. Each of the plurality of high pressure chambers 102 and the plurality of nozzles 106 can have identical arrangements in pressure, pressure drop, and nozzle 106 dimensions. The identical arrangements can provide rapid, successive film coatings 122 having identical properties.

In other examples, each high-pressure chamber 102 and nozzle 106 can have a different nozzle-substrate separation distance. The nozzle-substrate distance can result in successive film coatings where each film coating was formed by impacting nanomaterial 116 at a different velocity forming layers with different porosities.

The plurality of high pressure chambers 102 can be coupled with individual particle sources to ensure proper flow rate of nanomaterial 116 from the particle sources. A plurality of particle sources, one coupled to each high pressure chamber 102, can insure proper nanomaterial is provided to the high pressure chamber 102 to form a film coating 122 having a desired thickness.

FIG. 3C illustrates a particle deposition apparatus 100c having an upper high pressure chamber 102a and upper nozzle 106a and a lower high pressure chamber 102b and lower nozzle 106b. The upper high pressure chamber 102a and the lower high pressure chamber 102b can be maintained at differing settings as described above with respect to FIG. 3A or at identical settings as described above with respect to FIG. 3B. The upper nozzle 106a can be configured to form a film coating 122d on an upper surface 120a of the substrate 120 while the lower nozzle 106b can be configured to form a film coating 122e on a lower surface 120b of the substrate 120. Film coating 122d and film coating 122e can be differing or substantially similar properties depending on the arrangement of the upper high pressure chamber 102a and the upper nozzle 106a and the low pressure chamber 104b and the lower nozzle 106b. While FIG. 3C is illustrated in a substantially vertical arrangement having an upper nozzle and a lower nozzle, the particle deposition apparatus can be implemented with a substantially horizontal arrangement having one or more high pressure chambers 102 and nozzles coupled with a sidewall and depositing nanomaterial on a side surface of the substrate 120.

While FIGS. 3A-3C illustrate varying examples having the nozzle 106 at a substantially 90 degree angle relative to the substrate 120, it is within the scope of this disclosure to angle the nozzle 106 relative to the substrate 120 between approximately 0 and 30 degrees relative to the perpendicular axis of the substrate 120.

Figure 4:
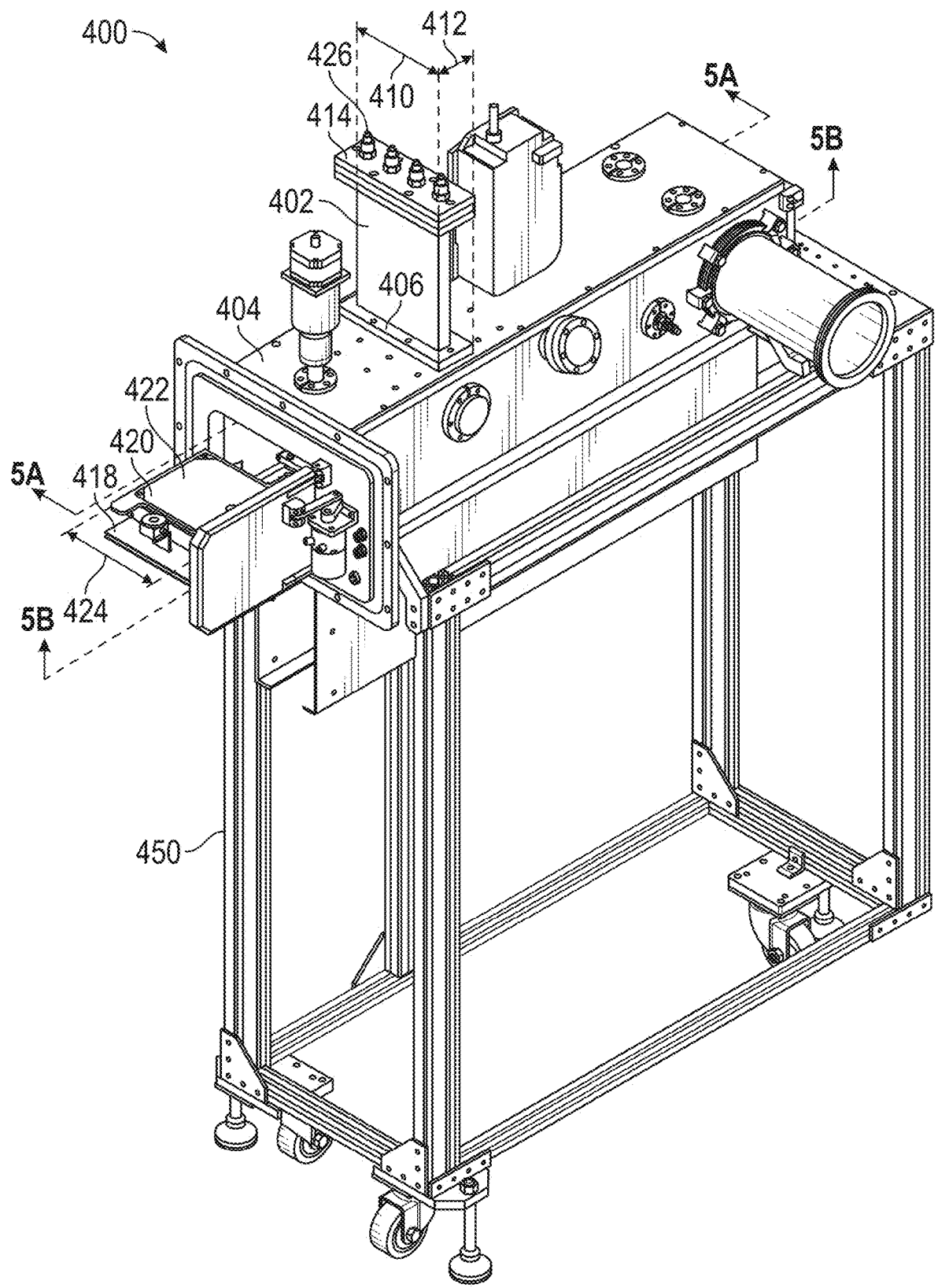
FIG. 4 is a isometric view of a particle deposition system including a particle source in accordance with the present disclosure.

FIG. 4 illustrates a particle deposition system 400 according to the present disclosure. The particle deposition system 400 can include a high pressure chamber 402 and a low pressure chamber 404. A nozzle 406 can be disposed between the high pressure chamber 402 and the low pressure chamber 404 providing fluidic communication therebetween. The nozzle 406 can have a nozzle opening 408 with a length 410 exceeding a width 412.

The high pressure chamber 402 can be coupled with a gas distribution system 414. The gas distribution system 414 can introduce a nanomaterial 416 to the high pressure chamber. The gas distribution system 414 can be a gas showerhead and/or a branching network of tubular gas lines terminating at different portions within the high pressure chamber 402. The gas distribution system 414 can ensure the nanomaterial 416 is evenly distributed within the high pressure chamber 402. In other embodiments, the gas distribution system 414 can be a fan nozzle configured to produce a flat spray of aerosol into the high pressure chamber 402.

The high pressure chamber 402 can have a variable pressure setting and/or variable temperature setting. The pressure and temperature settings of the high pressure chamber can be adjusted depending on the nanomaterial 416 implemented and/or the desired porosity of the film coating to be formed.

The low pressure chamber 404 can have a substrate receiving element 418 disposed therein. The substrate receiving element 418 can couple with a substrate 420. The substrate receiving element 418 can be configured to translate the substrate 420 within the low pressure chamber 404. Nanomaterial 416 flowing from the high pressure chamber 402 through the nozzle opening 406 impacts with the substrate 420 to form a film coating 422.

Translation of the substrate 420 within the low pressure chamber 404 can expose varying portions of the substrate 420 to the nozzle opening 408, thereby forming the film coating 422 on varying portions of the substrate 420. Translation of the substrate 420 can allow formation of film coatings 422 on substrate surface areas exceeding the surface area of the substrate receiving element 418. Translation of the substrate 420 through the low pressure chamber 404 can be a variable speed between 1 and 150 millimeters per second. Translation speed of the substrate 420 can vary depending on the desired film coating 422 thickness to be applied to the substrate 420.

The substrate receiving element 418 can have two rollers disposed on opposing ends of the low pressure chamber 404. The two rollers can be configured to translate the substrate 420 through the nanomaterial 416. One of the two rollers can be configured to store a roll of substrate 420 and transfer the substrate 420 during operation to the second roller, thus forming a film coating 422 on the substrate 420. The two rollers can be configured to allow extended lengths of substrate 420 to be coated within the low pressure chamber 404. In at least one example, at least one roller can be coupled with a motor to allow translation of the substrate 420 through the nanomaterial 416 at a predefined speed. The two rollers can each be coupled with a motor to allow translation of the substrate 420 through the nanomaterial 416 in multiple passes at an individually, predefined speed. In other examples, at least one roller can be coupled with a handle to allow manual translation of the substrate 420 through the nanomaterial 416. In yet other examples, the substrate receiving element can be translated using a screw drive powered by one or more servo motors.

The substrate receiving element 418 can also vary the separation between the substrate 420 and the nozzle 406. In at least one example, the substrate receiving element can adjust the separation from approximately 0 millimeters to approximately 30 millimeters.

The nozzle opening 406 can have a length 410 equal to or exceeding a width 424 of the substrate, thus allowing film coating 422 on the entire width 424 of the substrate 420. In at least one example, the low pressure chamber 404 can accommodate a substrate 420 having a width 424 of approximately 5 inches.

The low pressure chamber 404 can be maintained at a predetermined pressure by a vacuum pump 436. In at least one example, the vacuum pump 436 can maintain the low pressure chamber 404 between 0.001 Torr and 100 Torr.

The gas distribution system 414 can couple with a particle source 426. The particle source 426 can provide the particle deposition system 400 with the nanomaterial 416. The particle source 426 can produce an aerosolized nanomaterial 416 at a controlled rate for introduction into the high pressure chamber 402 via the gas distribution system 414. In at least one example, the particle source 426 can be an atomizer generating an aerosolized nanomaterial 416 from a colloidal solution, a solvent evaporation (for example, a salt), and/or a polymer/monomer that forms in flight. In other examples, the particle source 426 can be an atomizer producing an aerosolized nanomaterial 416 from a powder, a plasma reactor producing an aerosol from a precursor gas, a thermal reactor producing an aerosol from a precursor gas, and/or a flame reactor producing an aerosol from a precursor gas.

The gas distribution system 414 and the particle source 426 can have a particle introduction system 428 disposed therebetween. The particle introduction system 428 can transport the nanomaterial 416 from the particle source 426 to the gas distribution system 414. The particle introduction system 428 can modify the nanomaterial 416. In at least one example, the particle introduction system 428 can be piping formed from a material configured to prevent chemical or electrostatic interaction with the nanomaterial 416. In other examples, the particle introduction system 428 can be piping equipped with a heater configured to evaporate any solvent droplets, piping equipped with a diffusion dryer to evaporate any solvent, piping equipped with a mass flow controller configured to control the feed rate (for example, a regulator), and/or piping with one or more recycle streams to collect excess material from the generation process.

The high pressure chamber 402 can serve as a transition from the gas distribution system 414 to the nozzle 406. The high pressure chamber 402 can also further control gas distribution to insure uniformity, treat/alter the nanomaterial 416 or nanomaterial aerosol, and/or synthesize particles. In at least one example, the high pressure chamber 402 can function as the aerosol source. The high pressure chamber 402 can be configured to sustain a plasma and form particles from one or more precursor gases. The high pressure chamber 402 can be a thermal reactor forming particles from one or more precursor gases. For example a hollow chamber, a plasma reactor for treating/synthesizing particles, and/or a thermal reactor for treating/synthesizing particles.

The particle deposition system 400 can further include one or more processors configured to control the high pressure chamber 402, the low pressure chamber 404, the nozzle opening 406, the gas distribution system 414, substrate receiving element 418 and/or the particle source 426. The one or more processors can receive an input to maintain a particular pressure and/or temperature within the high pressure chamber 402 or low pressure chamber 404, the cross-sectional area of the nozzle opening 408, the distance between the nozzle 406 and the substrate 420, the translation speed of the substrate 420, and/or the pressure or flow rate of the particle source 426.

In at least one example, the particle deposition system 400 can receive user inputs to configure the particle deposition system 400 to a predetermined setting and the one or more processors can adjust the particle deposition system 400 to the predetermined setting. The predetermined settings can be determined by the substrate 420 being coating and the desired porosity and thickness of the desired film coating. In other examples, the one or more processors can receive a series of individual settings and the one or more processors can adjust the series of individual settings (for example, pressure, cross-sectional area, translation speed, etc.).

Figure 5A:
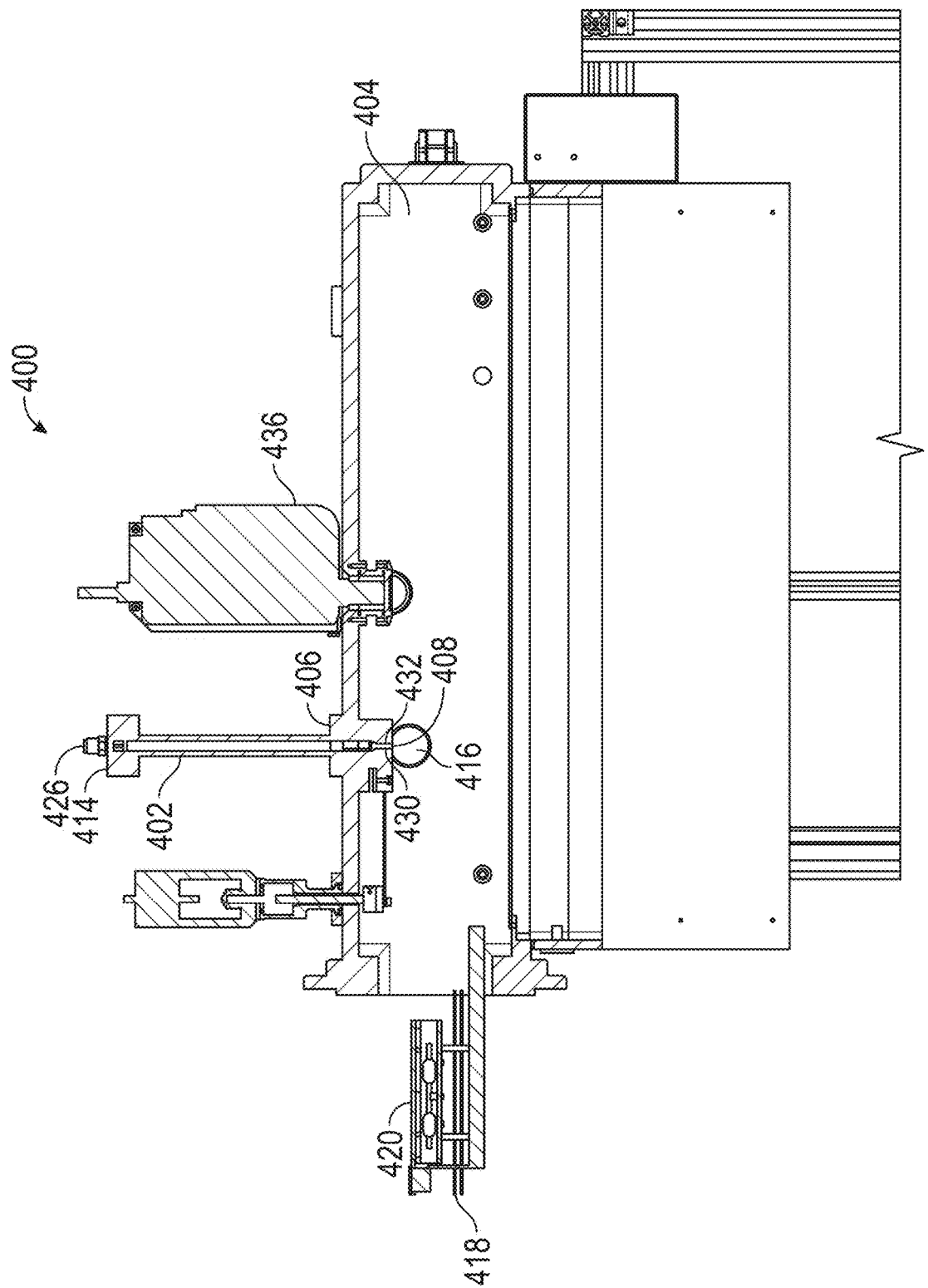
FIG. 5A is a cross-section view of the particle deposition system of FIG. 4 taken along line A-A.
Figure 5B:
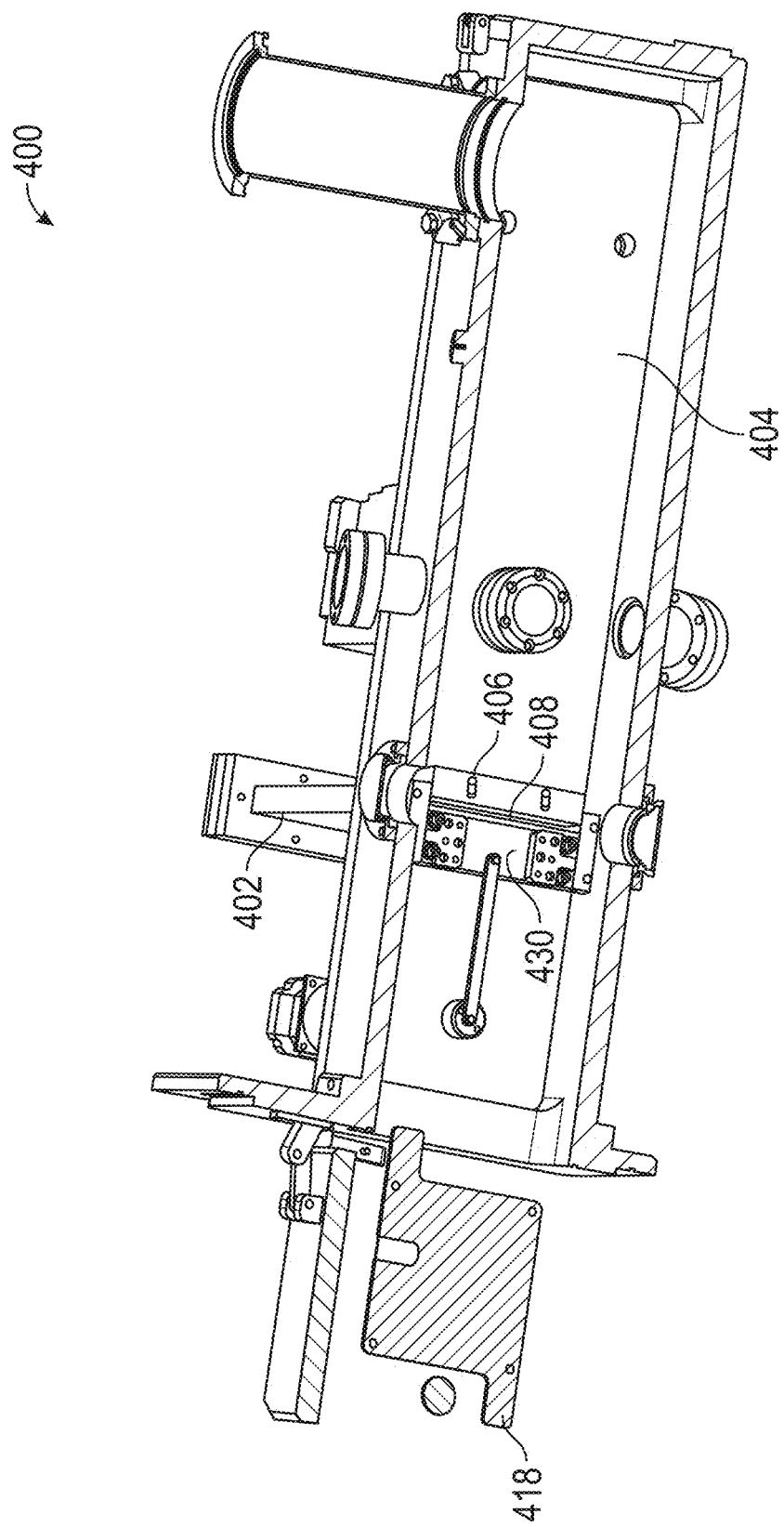
FIG. 5B is a bottom cross-section view of the particle deposition system of FIG. 4 taken along line B-B.

FIG. 5A illustrates a lateral cross-section view of the particle deposition system 400. FIG. 5B illustrates a bottom cross-section view of the particle deposition system 400. The nozzle 406 can have an adjustable cross-sectional area by varying the width 412 relative to the length 410. The nozzle opening 408 can have two opposing side walls 430, 432 forming the width 412. At least one opposing sidewall 430, 432 can be moveable along the width 412 relative to the other opposing sidewall 430, 432. Movement of one opposing sidewall 430, 432 closer to the other opposing sidewall 430, 432 can decrease the nozzle opening 408 cross-sectional area, while movement of one opposing sidewall 430, 432 away from the other opposing sidewall 430, 432 can increase the nozzle opening 408 cross-sectional area. The cross-sectional area can be defined by the length 410 times the width 412 of the nozzle opening 408.

In at least one example, at least one opposing sidewall 430, 432 is coupled with a motor or actuator configured to move the at least one opposing sidewall 430, 432 relative to the other opposing sidewall 430, 432. In other examples, the nozzle opening 408 can have a motor or actuator coupled with each of the two opposing sidewalls 430, 432 allowing independent movement of each opposing sidewall 430, 432 relative to one another. The nozzle opening 408 can have a pattern of openings allowing specific and pre-determined patterns to be formed within a film coating on the substrate 420. In at least one example, the nozzle opening 408 can have a pattern of openings blocking at least a portion of the length 410, thus allowing a greater quantity of nanomaterial 416 to be accelerated onto a particular portion of the substrate 420. The nozzle opening 408 can be blocked along at least a portion of the length 410, thus preventing overspray of a narrower substrate 420 while also allowing thicker coatings to be formed due to increased nanomaterial 416 from the particle source 420 sprayed over a smaller area.

In at least one example, the nozzle opening 408 can have a length 410 of approximately 5 inches and width 412 variable between approximately 0.001 inches and 0.2 inches. Reduction of the width 412 can increase the pressure in the high pressure chamber 402. Increasing the width 412 can reduce the pressure in the high pressure chamber 402.

The particle deposition system 400 can have a base 450 configured to support the low pressure chamber 404. The base 450 can be a substantially tubular structure configured to provide structure support for the high pressure chamber 402, low pressure chamber 404, and gas distribution system 414. In at least one example, the base 450 can include tubular members having feed lines for the particle source 426 disposed therein. The base 450 can have one or more wheels 452 configured to allow movement and positioning of the particle deposition system 400.

While the particle deposition system 400 is shown having a single high pressure chamber 402 and nozzle 406, it is within the scope of this disclosure to implement any number of high pressure chambers 402 and nozzles 406, for example three, four, or more, within the particle deposition system 400.

Figure 6:
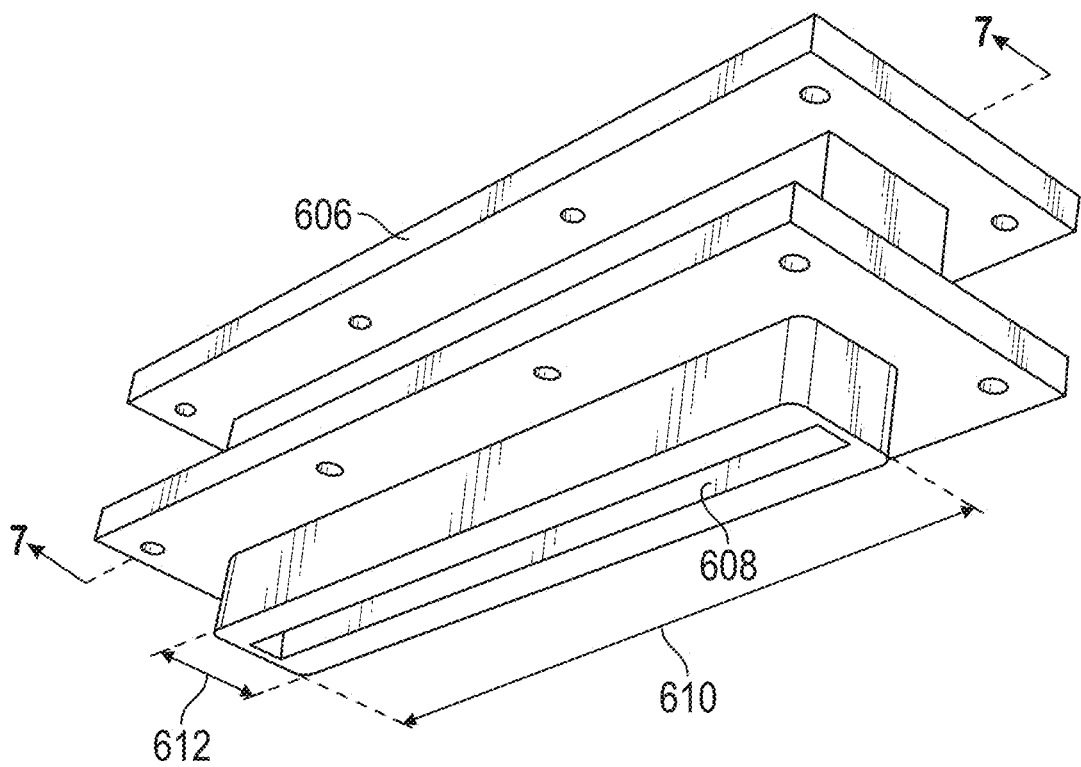
FIG. 6 is a isometric view of a fixed nozzle of a particle deposition system in accordance with the present disclosure.

FIG. 6 illustrates an example embodiment of a nozzle 606. The nozzle 606 can be implemented within particle deposition apparatus 100 or particle deposition system 400. The nozzle 606 can have a fixed cross-sectional area defined by a fixed length 610 and fixed width 612. A particle deposition system 400 implementing the nozzle 606 having a fixed cross-sectional area can produce varying film coatings 422 by varying other parameters within the particle deposition system 400, for example, high pressure chamber 402 settings, low pressure chamber 404 settings, distance between nozzle 606 and substrate 420, and/or particle source 426 settings.

Figure 7:
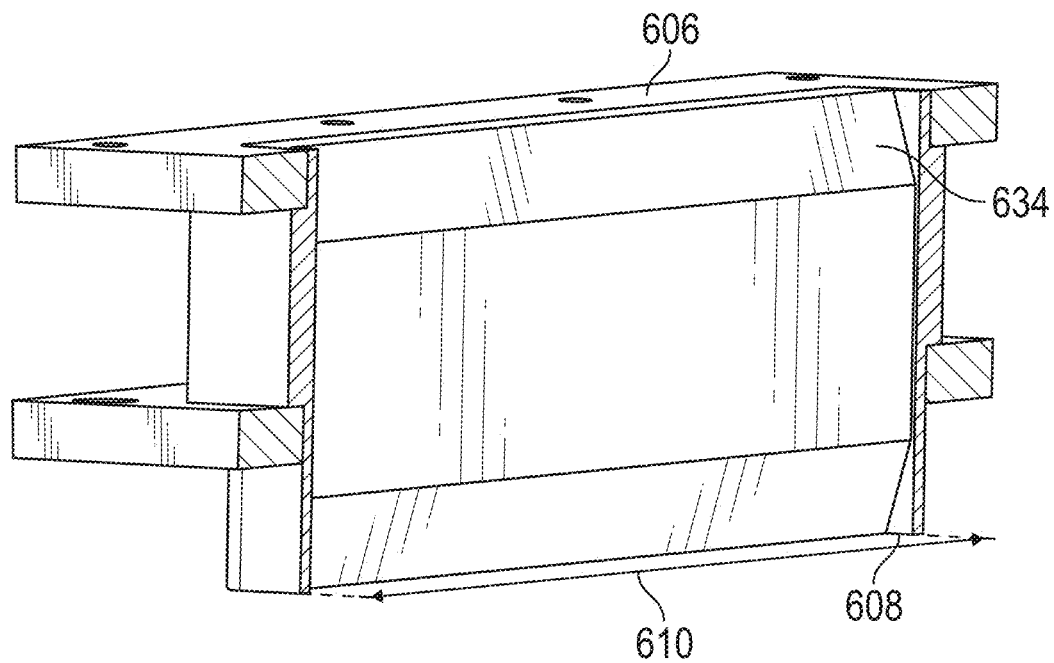
FIG. 7 is a cross-section view of the fixed nozzle of FIG. 6 taken along line C-C.

FIG. 7 illustrates a cross-sectional view of nozzle 606. The nozzle 606 can have inwardly sloped sidewalls 634 formed along the length 610 of the nozzle 606. The sloped sidewalls 634 can form the reduced cross-sectional area thus accelerating nanomaterial through the nozzle 606. In at least one example, the nozzle 606 can accelerate nanomaterials 616 to hypersonic speeds. In other examples, the nozzle 606 can accelerate the nanomaterial 616 to subsonic or supersonic speeds.

FIGS. 8A-8D illustrate example film coatings 822 deposited on a substrate 820 according to the present disclosure.

FIG. 8A illustrates a SEM cross-section of a film coating. The magnification at 500× and 100,000× details a film coating of 20 nanometer (nm) diameter silica ($SiO_2$) nanoparticles. These nanoparticles started out as a colloidal solution that was atomized and fed into the deposition system where they were deposited on a polished silicon substrate.

FIG. 8B illustrates a SEM cross-section at 35,000× magnification of a film composed of 25 nm diameter titania (TiO$_2$) nanoparticles. These nanoparticles started out as a colloidal solution that was atomized and fed into the deposition system where they were deposited on a polished silicon substrate. A metallic coating was deposited on top using a sputtering system to improve the image quality.

Figure 8C:
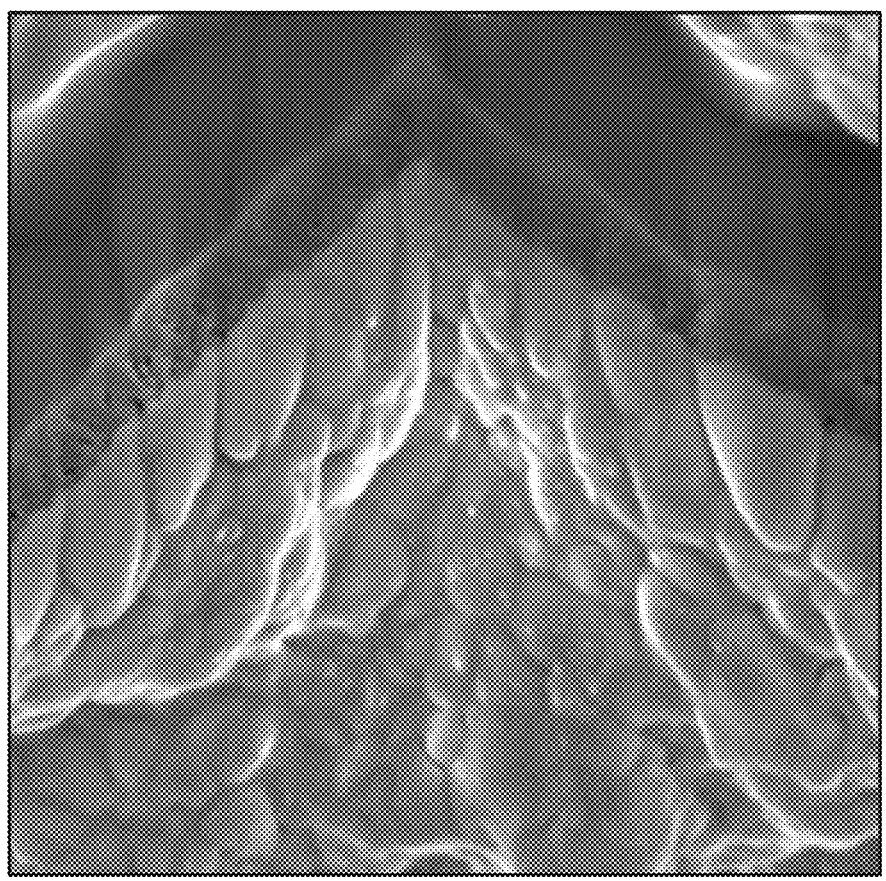
FIG. 8C is an SEM micrograph of a nanomaterial coating of silicon (Si) applied using a particle deposition system according to the present disclosure.

FIG. 8C illustrates an SEM cross-section of a film composed of 7 nm diameter silicon (Si) nanoparticle. The nanoparticles were deposited on a textured solar cell between the cell and the electrical contact (silver layer). These nanoparticles were synthesized from precursor gasses (Silane [SiH$_4$] and helium) in a plasma reactor coupled to the deposition system. The particles were dragged out of the plasma reactor into the deposition system where they were deposited on the substrate.

Example

The current design is an aluminum body of the same internal volume (273 cm$^3$) and shape as the quartz tube. The chamber's two electrodes are electrically isolated from the grounded chamber via a Teflon cover and are in direct contact with the precursor gas. Aluminum was chosen as a material because of mechanical strength, relatively easy machinability and its widespread and proven use in the semiconductor industry.

Figures 9A, 9B, 9C:
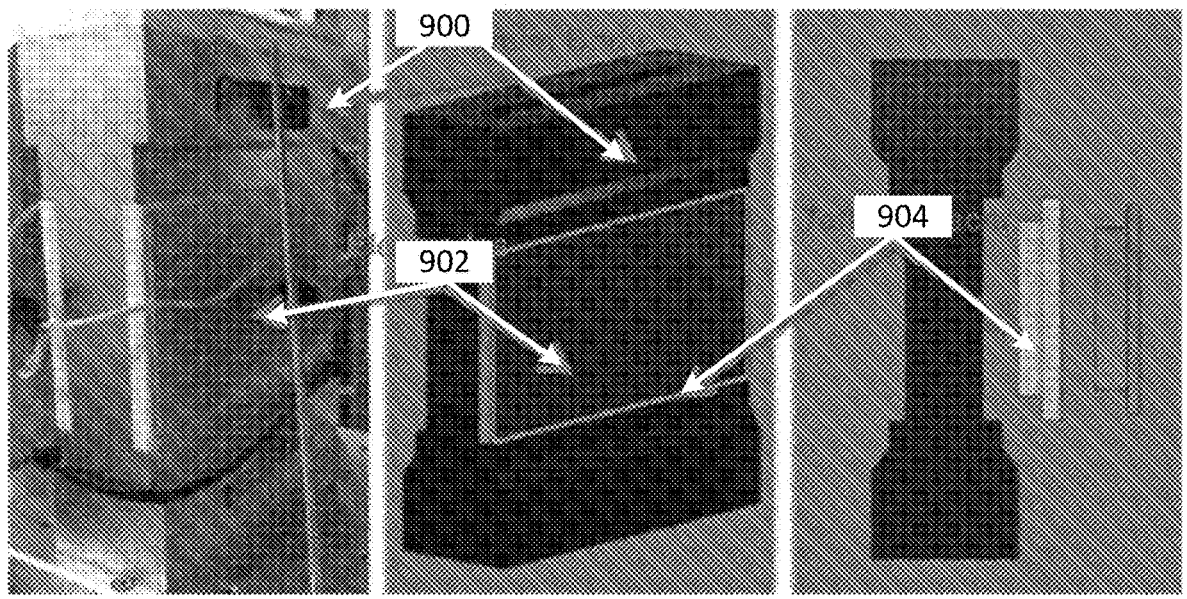
FIGS. 9A-9C depict an aluminum reaction chamber having parallel plate electrodes.

The chamber was designed to be capable of operating as both a symmetric and asymmetric reactor. Symmetric plasma reactors have hot and ground electrodes that are comparable in surface area and are known to produce very uniform plasmas. FIGS. 9A-9C depicts aluminum reaction chamber 900 having parallel plate electrodes 902 and Teflon spacer 904.

A plasma is sustained in a closed loop circuit by flowing current from the generator into the plasma through the chamber walls and back to the generator. In order to optimize power transfer into the plasma it is necessary to match the impedance of the generator to that of the load (chamber+plasma).

Figure 10:
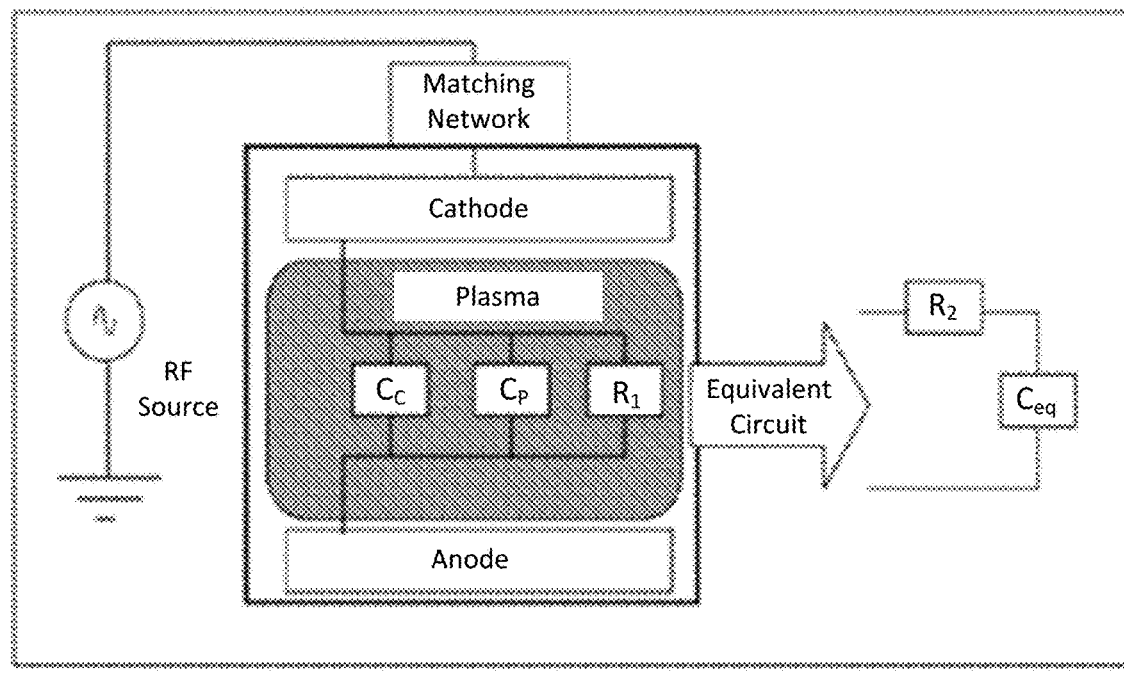
FIG. 10 depicts an equivalent circuit of a capacitively coupled plasma.

An equivalent circuit for a reaction chamber and plasma consists of two capacitive elements and a resistive element arranged in parallel. A properly designed matching network aims to convert the impedance of the chamber and plasma to look like the 50 ohm impedance of the RF power supply and the connecting cables. FIG. 10 depicts an equivalent circuit of a capacitively coupled plasma, with $C_C$=cold capacitance, $C_P$=plasma capacitance, $R_1$=parallel resistance, $R_2$=series resistance, and $C_{eq}=C_C+C_P$.

Figure 8D:
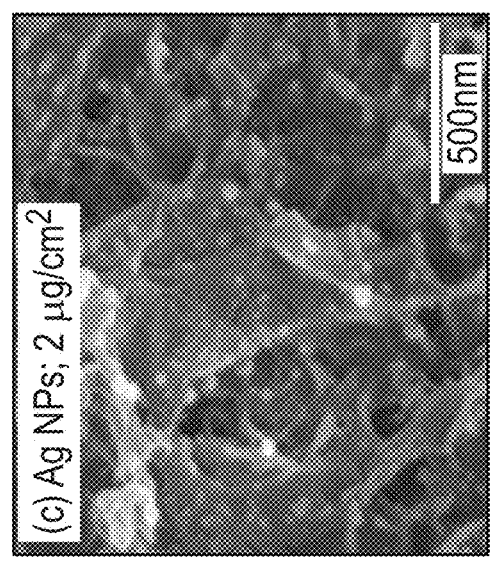
FIG. 8D is an SEM micrograph of a nanomaterial coating of silver (Ag) nanoparticles applied using a particle deposition system according to the present disclosure.
Figure 8D:
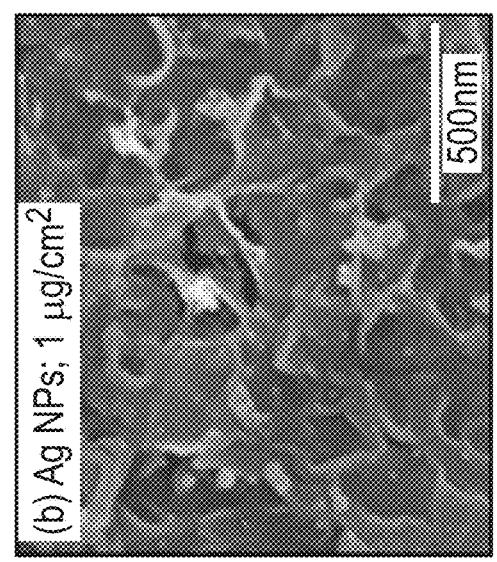
Figure 8D:
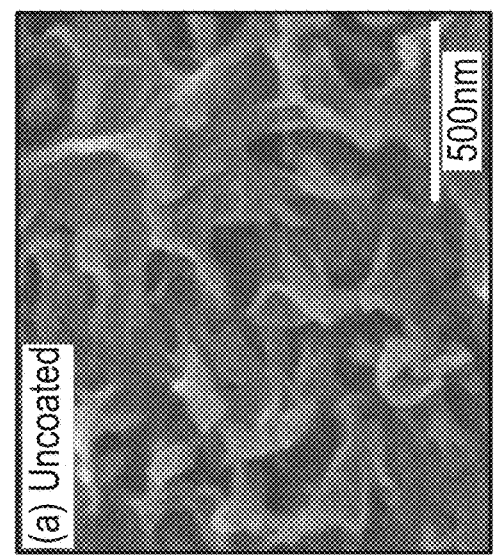

FIG. 8D illustrates SEM cross-sections of a 50 nm diameter silver nanoparticles deposited on a water filtration membrane. These nanoparticles started out as a colloidal solution that was atomized and fed into the deposition system where they were deposited on a polished silicon substrate.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A particle deposition apparatus comprising:
    a first chamber comprising two plate-shaped electrodes positioned on opposite sides of the first chamber and configured to be in direct contact with a plurality of precursors inside the first chamber, wherein the first chamber is configured to sustain a plasma for producing a nanoparticle aerosol from the plurality of precursors, wherein the plurality of precursors comprises gas precursors, vapor precursors, or both;
    a second chamber configured to be maintained at a pressure below that of the first chamber and operable to receive at least a portion of a substrate therein, the at least one portion of the substrate translatable within the second chamber; and
    a nozzle disposed between the first chamber and the second chamber and allowing fluidic communication therebetween, the nozzle configured to form a fluidic constriction of the nanoparticle aerosol between the first chamber and the second chamber, wherein the nozzle defines an exit opening having a length exceeding a width, the length of the nozzle exit opening being substantially perpendicular to a translation direction of the substrate,
    wherein the first chamber is configured to be mechanically coupled to the second chamber, and
    wherein the nozzle is configured to be coupled to the first chamber.

2. The particle deposition apparatus of claim 1, further comprising a radio frequency source operably coupled to the plate-shaped electrodes.

3. The particle deposition apparatus of claim 1, wherein the nozzle exit opening has a width between about 0.001 inches and about 0.2 inches.

4. The particle deposition apparatus of claim 1, wherein the second chamber comprises a substrate-receiving element operable to receive the substrate thereon.

5. The particle deposition apparatus of claim 4, wherein the substrate is translatable on the substrate-receiving element under the nozzle in a direction perpendicular to the length of the nozzle exit opening.

6. The particle deposition apparatus of claim 1, further comprising:
    a third chamber capable of producing an additional nanoparticle aerosol from an additional plurality of precursors comprising gas precursors, vapor precursors, or both; and
    an additional nozzle between the third chamber and the first chamber and allowing fluidic communication therebetween.

7. The particle deposition apparatus of claim 1, wherein at least one of the plurality of precursors is silicon-containing and one of the plurality of precursors is oxygen-containing.

8. The particle deposition apparatus of claim 1, wherein at least one of the plurality of precursors is titanium-containing and one of the plurality of precursors is oxygen-containing.

9. A particle deposition system comprising a plurality of particle deposition apparatuses of claim 1.

10. The particle deposition system of claim 9, wherein the corresponding dimensions of each nozzle exit opening are substantially parallel.

11. The particle deposition system of claim 9, wherein each second chamber comprises a substrate-receiving element configured to translate at least a portion of each substrate past the nozzle exit opening of each of the plurality of particle deposition apparatuses in a direction perpendicular to each nozzle exit opening length.

12. The particle deposition system of claim 9, wherein the plurality of particle deposition apparatuses is configured to deposit one or more coatings of two or more materials.

13. The particle deposition system of claim 9, wherein the plurality of particle deposition apparatuses is configured to deposit one or more coatings of a predetermined material.

14. The particle deposition system of claim 9, wherein a first one of the nozzle exit openings has an exit direction oriented toward an exit direction of a second one of the nozzle exit openings.

15. The particle deposition apparatus of claim 1, wherein the nozzle exit opening is configured to accelerate the nanoparticle aerosol toward the substrate to deposit a coating thereon.

16. The particle deposition system of claim 9, wherein at least one of the nozzle exit openings is configured to accelerate the nanoparticle aerosol toward the corresponding substrate to deposit a coating thereon.

17. The particle deposition apparatus of claim 1, wherein the first chamber is mechanically coupled to the second chamber.

18. The particle deposition apparatus of claim 1, wherein the nozzle is coupled to the first chamber.

19. The particle deposition apparatus of claim 1, further comprising a vacuum pump in fluidic communication with the second chamber.

20. A method of particle deposition comprising:
producing a nanoparticle aerosol in the particle deposition apparatus of claim 1, wherein the plasma is sustained between the plate-shaped electrodes and the nanoparticle aerosol is synthesized from the plurality of precursors;
transporting the nanoparticle aerosol to the nozzle;
accelerating the nanoparticle aerosol through the nozzle exit opening to a predetermined velocity into the second chamber, the nozzle operably forming a fluidic constriction of the nanoparticle aerosol between the first chamber and the second chamber; and
impacting the nanoparticle aerosol against the substrate at the predetermined velocity in the second chamber.

21. The method of claim 20, further comprising controlling the predetermined velocity by adjusting the pressure in the second chamber.

22. The method of claim 20, further comprising controlling the predetermined velocity by adjusting a pressure in the first chamber.

23. The method of claim 20, further comprising controlling the predetermined velocity by adjusting a geometric feature of the nozzle.

24. The method of claim 20, further comprising controlling the predetermined velocity by adjusting a separation between the nozzle and the substrate.

25. The method of claim 20, further comprising controlling the predetermined velocity by adjusting the pressure in the second chamber, adjusting a pressure in the first chamber, adjusting a geometric feature of the nozzle, adjusting a separation between the nozzle and the substrate, or any combination thereof.

26. The method of claim 20, further comprising forming a coating of the nanoparticle on the substrate.

27. The method of claim 26, further comprising controlling a porosity of the coating by adjusting the predetermined velocity.

28. The method of claim 26, wherein the porosity is within 1% of a predetermined porosity having a value between about 1% and about 97%.

29. The method of claim 26, further comprising controlling a thickness of the coating by adjusting a volume of nanoparticle impacted against the substrate.

30. The method of claim 26, wherein a thickness of the coating is within 1% of a predetermined thickness having a thickness value between about 1 nm and about 1 mm.

* * * * *